United States Patent
Siddiqui et al.

(10) Patent No.: US 10,175,266 B1
(45) Date of Patent: Jan. 8, 2019

(54) WAFER LEVEL ELECTRICAL PROBE SYSTEM WITH MULTIPLE WAVELENGTH AND INTENSITY ILLUMINATION CAPABILITY SYSTEM

(71) Applicants: Jeffrey J. Siddiqui, Sacramento, CA (US); Ajit Sandhu, Yuba City, CA (US); Joe Y. Liu, Roseville, CA (US)

(72) Inventors: Jeffrey J. Siddiqui, Sacramento, CA (US); Ajit Sandhu, Yuba City, CA (US); Joe Y. Liu, Roseville, CA (US)

(73) Assignee: The United States of America as Represented by the Secretary of the Army, Washington, DC (US)

(*) Notice: Subject to any disclaimer, the term of this patent is extended or adjusted under 35 U.S.C. 154(b) by 361 days.

(21) Appl. No.: 14/662,575

(22) Filed: Mar. 19, 2015

Related U.S. Application Data

(60) Provisional application No. 61/978,292, filed on Apr. 11, 2014.

(51) Int. Cl.

| | |
|---|---|
| *G01R 31/26* | (2014.01) |
| *G01R 31/28* | (2006.01) |
| *G01R 31/311* | (2006.01) |
| *G01R 1/07* | (2006.01) |
| *G01R 31/265* | (2006.01) |

(52) U.S. Cl.
CPC .......... *G01R 1/071* (2013.01); *G01R 31/2656* (2013.01)

(58) Field of Classification Search
CPC ........ G01R 27/26; G01R 31/00; G01R 31/26; G01R 31/265; G01R 31/2831; G01R 31/2635; G01R 31/311; G01R 31/2656; G01R 31/2648; G02B 26/04; G02B 26/08; G02B 5/08; G06F 19/00
USPC ...... 324/754.21, 754.23, 765, 158, 73.1, 96, 324/762.01, 762.05, 757.03, 750.02; 702/122

See application file for complete search history.

(56) References Cited

U.S. PATENT DOCUMENTS

| | | | | |
|---|---|---|---|---|
| 5,150,043 A | * | 9/1992 | Flesner ................ | G01R 31/308 324/750.14 |
| 5,365,334 A | * | 11/1994 | Bottka ................ | G01N 21/1717 356/326 |
| 5,754,294 A | * | 5/1998 | Jones ..................... | G01B 11/06 356/432 |
| 6,100,537 A | * | 8/2000 | Abraham ........... | G01N 21/8903 250/559.22 |
| 6,339,217 B1 | * | 1/2002 | Kley ..................... | B82Y 20/00 250/216 |
| 6,567,213 B2 | * | 5/2003 | Rosencwaig ...... | G01B 11/0641 359/369 |

(Continued)

*Primary Examiner* — Jermele M Hollington
*Assistant Examiner* — Neel Shah
(74) *Attorney, Agent, or Firm* — John P. DiScala

(57) ABSTRACT

A wafer level electrical probe system with multiple wavelength and intensity illumination capability system that enables concurrent reliability studies of illumination stimulation, electrical stimulation, and the interplay of both electrical and illumination stimulation. The probe system includes five sub-systems: a controllable wavelength and intensity illumination input sub-system with two different configurations; a wafer level electrical probe sub-system; an illumination intensity calibration sub-system; an illumination delivery sub-system; and an illumination wavelength calibration sub-system.

12 Claims, 6 Drawing Sheets

(56) References Cited

U.S. PATENT DOCUMENTS

| | | | |
|---|---|---|---|
| 7,212,288 B2* | 5/2007 | Opsal | G01N 21/636 356/432 |
| 7,262,425 B2* | 8/2007 | Nishiyama | G01N 21/274 250/559.4 |
| 2004/0140820 A1* | 7/2004 | Sakagawa | G01R 31/2851 324/754.07 |
| 2009/0101948 A1* | 4/2009 | Park | H01L 27/14609 257/292 |
| 2009/0236506 A1* | 9/2009 | Dudgeon | G01J 1/42 250/228 |
| 2010/0117669 A1* | 5/2010 | Clarke | G01R 31/2887 324/756.03 |
| 2012/0136614 A1* | 5/2012 | Liu | G01R 31/2831 702/122 |
| 2015/0002182 A1* | 1/2015 | Eiles | G01R 31/2656 324/762.01 |
| 2015/0177313 A1* | 6/2015 | Hoelter | G02B 27/0977 324/754.21 |

* cited by examiner

WAFER LEVEL ELECTRICAL PROBE SYSTEM WITH MULTIPLE WAVELENGTH AND INTENSITY ILLUMINATION CAPABILITY SYSTEM

CROSS REFERENCE TO RELATED APPLICATION

This application claims the benefit of U.S. Provisional Patent Application Ser. No. 61/978,292, filed on Apr. 11, 2014, which is incorporated herein by reference.

GOVERNMENTAL INTEREST

The invention described herein may be manufactured and used by, or for the Government of the United States for governmental purposes without the payment of any royalties thereon.

FIELD OF THE INVENTION

The present invention relates in general to the field of wafer manufacturing. Specifically, this invention relates to the testing of electronic devices on a wafer. More specifically, the present invention relates to a wafer level electrical probe system with multiple wavelength and intensity illumination capability system that enables concurrent reliability studies of illumination stimulation, electrical stimulation, and the interplay of both electrical and illumination stimulations.

BACKGROUND OF THE INVENTION

Conventionally, the general focus of wafer level probe system manufacturers has been on optimizing products and customers throughputs, while the emerging industry of transparent and thin film semiconductor industry has not been receiving due consideration, awaiting its maturity in the marketplace. New technologies in this emerging industry include, for example, zinc oxide-based semiconductors that can be used in various applications such as transparent electronics.

However, transparent electronics are sensitive to the various photonic energies of incident lights at different wavelengths. As a result, the problem currently facing the industry in this field revolves around a better understanding of the reaction of the new technologies to illumination rich environments. This problem can be analyzes in terms of two key issues: (1) How does the material system work; and (2) how do devices, prototypes, and products act in illumination rich environments.

The following exemplary online websites illustrate the state of the art in the field of the present invention:
  http://www.cascademicrotech.com/products;
  http://www.signatone.com;
  http://www.escitec.com;
  http://www.semiprobe.com/our-solutions/specialty-probers/;
  http://www.micromanipulator.com/products; and
  http://www.micromanipulator.com/products.

However, none of the current manual wafer probe station manufacturers offer a combined illumination/electrical performance and/or reliability tool. As an example, one manufacturer focuses on test equipment for electronics that will be sealed and packaged. Another manufacturer offers illumination or optics that use microscopes for sample alignment purposes, but not illumination testing. Yet another manufacturer offers an "optoelectronic system" capable of probing electrically, and measuring the output of light emitting devices; however, while this conventional system may provide a solution for semiconductor emitters, it does not do so for intentional and unintentional detectors. Still another manufacturer offers several models of manual probe stations geared at the silicon market, with a specialty tool that does not address illumination measurements.

Present day researchers use simple light bulbs to simulate the visible spectrum, or light emitting diodes to simulate a more specific, but still general spectrum, such as "green light," to create a general atmosphere of illumination, while the on-wafer devices are being tested for reliability. However, neither well controlled and calibrated light spectrum and intensity control, nor tools that can conduct such experiments repeatedly, have been reported.

While the foregoing conventional methods and test equipment have provided a certain level of wafer level reliability testing, there still remains a need for a more efficient wafer level electrical probe system with multiple wavelength and intensity illumination capabilities, which would enable concurrent reliability studies of illumination stimulation, electrical stimulation, and the interplay of both electrical and illumination stimulation.

SUMMARY OF THE INVENTION

The present invention addresses the foregoing concerns and presents a new and efficient wafer level electrical probe system with multiple wavelength and intensity illumination capability system. The probe system enables concurrent reliability studies of illumination stimulation, electrical stimulation, and the interplay of both electrical and illumination stimulation.

The present probe system enables researchers to run controlled experiments whereby the illumination wavelength and intensity can be changed. Using data from these controlled experiments, researchers can learn about the materials system of their technology and make improvements at the materials and physics level. Furthermore, the probe system enables engineers determine the way a device, circuit, prototype, or product acts under a very specific wavelength (or wavelength mix) and intensity (for quality assurance purposes). With multiple wavelengths and intensities to select from, the probe system provides the ability to deliver an extremely accurate known spectrum of light and intensity to a wide range of devices being tested.

To this end, the probe system generally includes the following five sub-systems:
  (1) A controllable wavelength and intensity illumination input sub-system, having:
    a. a visible light spectrum configuration (A); and
    b. an ultraviolet light spectrum configuration (B).
  (2) A wafer level electrical probe sub-system.
  (3) An illumination intensity calibration sub-system.
  (4) An illumination wavelength calibration sub-system.
  (5) An illumination delivery sub-system.

The wafer level electrical probe sub-system includes a manual probe sub-system that is retrofitted to allow the illumination delivery sub-system to be mounted to the station positioned platen. Manual wafer probers are placed at specific locations in order to contact with a test wafer, and allow the illumination delivery sub-system to be positioned directly above the device under test (DUT). While the present invention is described herein in connection with the delivery of electrical stimulation/stress to a wafer chuck, it should be understood that the present invention may equally be used with a non-wafer device, circuit, or prototype.

A blackout curtain is placed over the entire probe system setup, without touching sensitive equipment, such as the manual probers. The blackout curtain is important to the setup in that it prevents light pollution that can significantly affect the research results. A custom test software is developed to control the electrical stimulation and to measure the electrical performance via the manual wafer probers. Alignment marks are positioned throughout the probe system for accurate and efficient re-configuration and setup.

As a result, the present probe system is capable of stimulating, at the device level, both electrically and optically, and then measuring the electrical output in terms of performance and reliability.

BRIEF DESCRIPTION OF THE DRAWINGS

The accompanying drawings, which are incorporated in, and constitute part of this specification, illustrate embodiments of the invention and together with the description, serve to explain the principles of the invention. The embodiments illustrated herein are presently preferred, it being understood, however, that the present invention is not limited to the precise arrangements and instrumentalities shown, wherein.

Similar numerals refer to similar elements in the drawings. It should be understood that the sizes of the different components in the figures are not necessarily in exact proportion or to scale, and are shown for visual clarity and for the purpose of explanation.

DETAILED DESCRIPTION OF PREFERRED EMBODIMENTS

Figure 1:
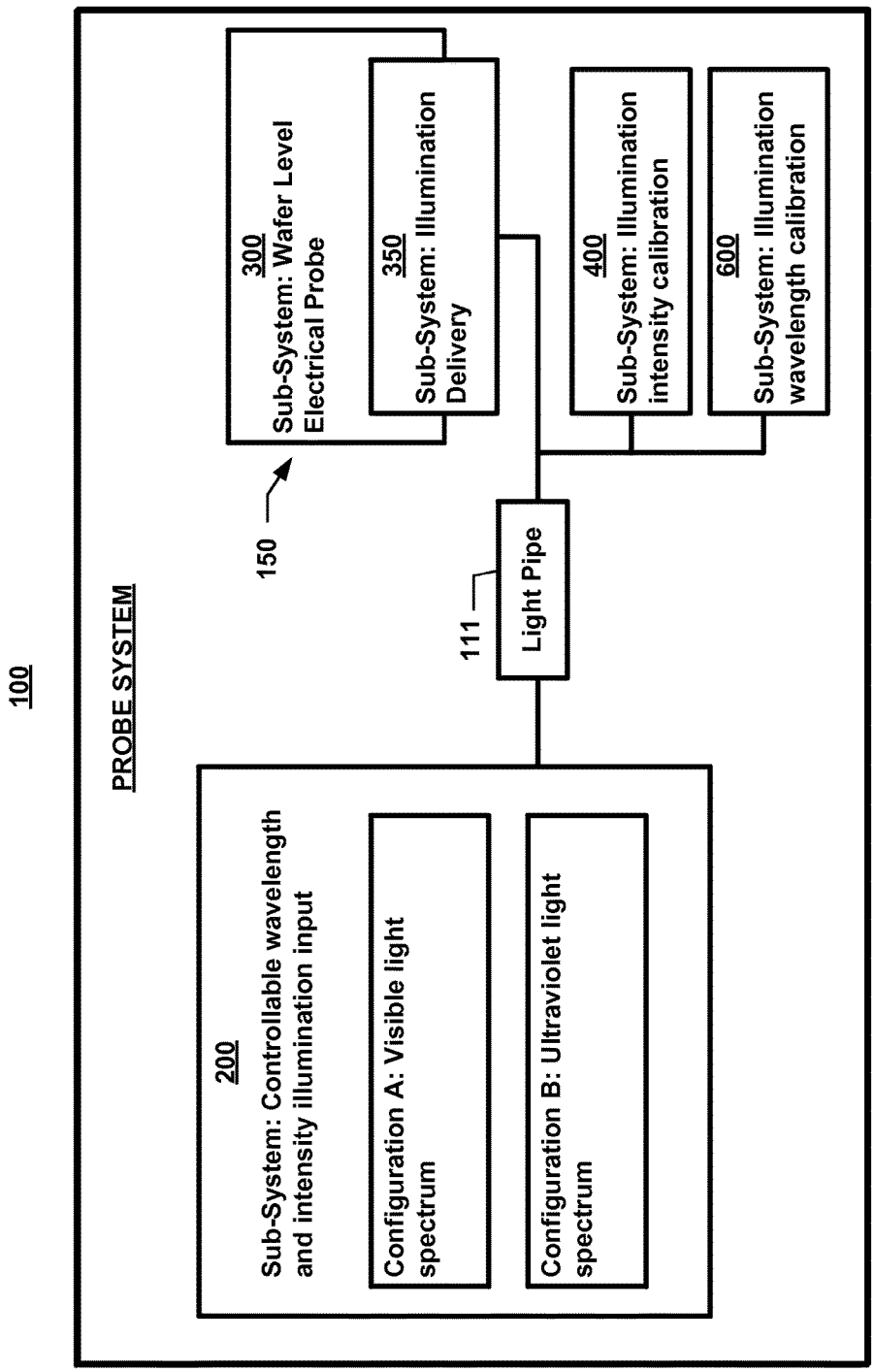
FIG. 1 is a high-level block diagram of a wafer level electrical probe system (or probe system) according to a preferred embodiment of the present invention.

With reference to FIG. 1, it illustrates a block diagram of a probe system 100, according to a preferred embodiment of the present invention. The probe system 100 generally includes the following five sub-systems, that are interconnected by a light pipe (or light guide) 111:

(1) A controllable wavelength and intensity illumination input sub-system 200 that provides two alternative configurations:
 a. a visible light spectrum configuration (A); and
 b. an ultraviolet light spectrum configuration (B).
(2) A wafer level electrical probe sub-system 300.
(3) An illumination delivery sub-system 350.
(4) An illumination intensity calibration sub-system 400.
(5) An illumination wavelength calibration sub-system 600.

Figure 2:
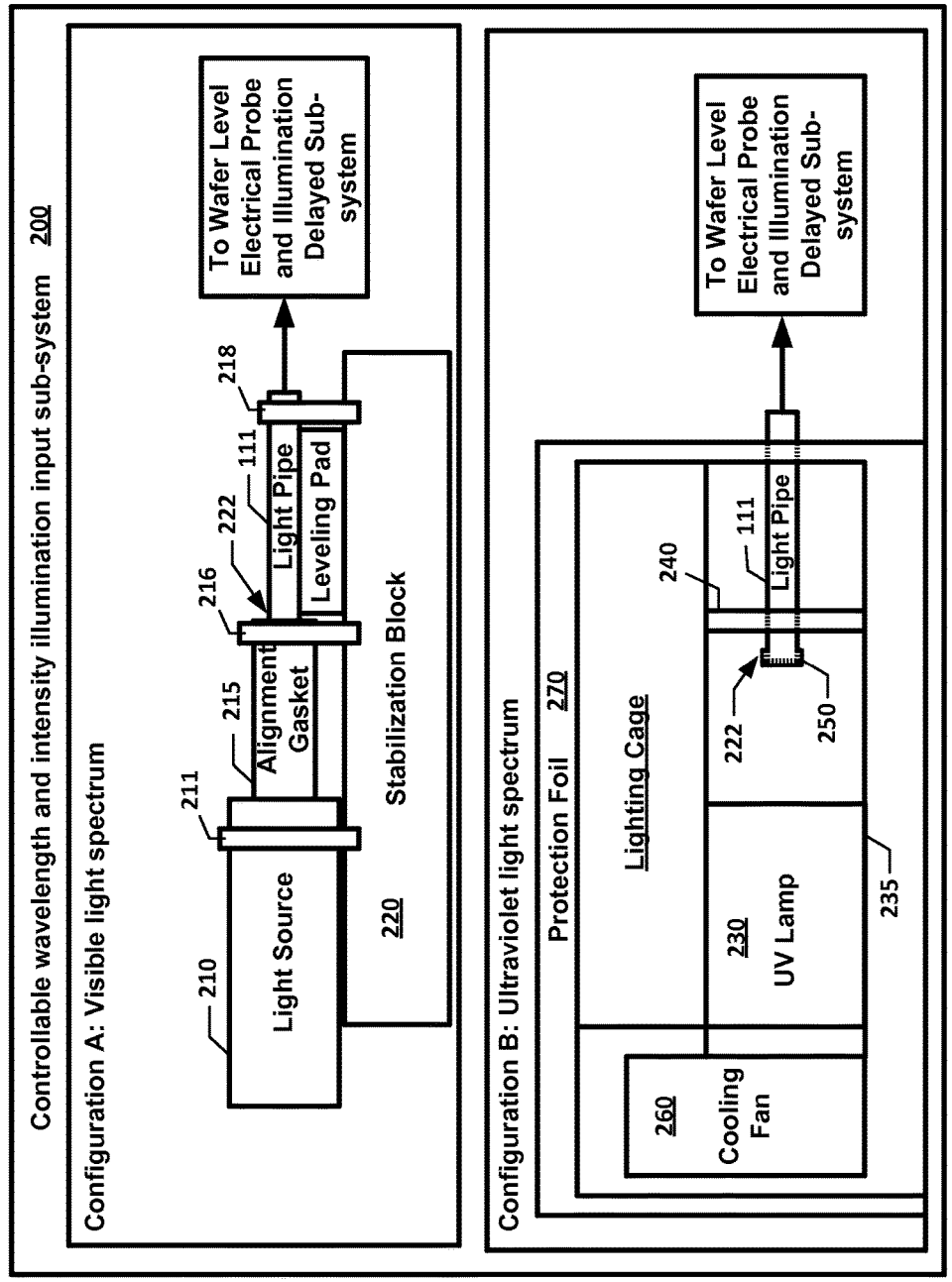
FIG. 2 is a block diagram of a controllable wavelength and intensity illumination input sub-system that forms part of the probe system of FIG. 1, with two alternative configurations: a visible light spectrum configuration (A), and an ultraviolet light spectrum configuration (B)

Considering the probe system 100 in more detail with further reference to FIG. 2, the controllable wavelength and intensity illumination input sub-system 200 is configurable into two alternative configurations:

The first is configuration A, which is also referred to as "visible light spectrum configuration." Configuration A includes a remote-controlled multiple wavelength light source, such as a light (or LED) source 210, such as, for example, a 5 W Hi-Power RBG LED Spot, sold by LEDwholesalers.com. The light source 210 is connected to the light pipe 111 to provide light within the visible light spectrum, with predetermined wavelength and intensity settings, at the input end 222 of the light pipe 111 (e.g., an Edmond Optics ½ inch light guide).

The light source 210 and the light pipe 111 are carefully aligned and locked in place relative to each other on, for example, a stabilization block 220. The light source 210 is aligned relative to the light pipe 111 using a custom alignment gasket 215. The light source 210, the alignment gasket 215, and the light pipe 111 are secured to the stabilization block 220 by means of fasteners (or fastening means) 211, 216, and 218.

The second is configuration B, which is also referred to as "ultraviolet light spectrum configuration." Configuration B includes an ultraviolet (UV) light source 230 (also referred to herein as UV lamp) with a predetermined wavelength output. The UV light source 230 is set within a metallic rack 235. The UV light source 230 is aligned relative to the light pipe 111 through a custom circular plate 240, which is clamped onto the rack 235.

An optical filter 250 is placed over the input end 222 of the light pipe 111, to filter the appropriate wavelengths. Various markings are positioned throughout the sub-system 200 for accurate re-configuration or setup. The intensity of the UV light is controlled by moving the distance of the alignment plate 240, and thus the input end 222 of the light pipe 111, from the UV light source 230, at set positions. A cooling fan 260 is used to cool the UV light source 230. A protection foil 270 is placed around the rack 235 to block harmful-to-humans UV light from escaping the sub-system 200 in any direction other than through the light pipe 111.

Figure 3:
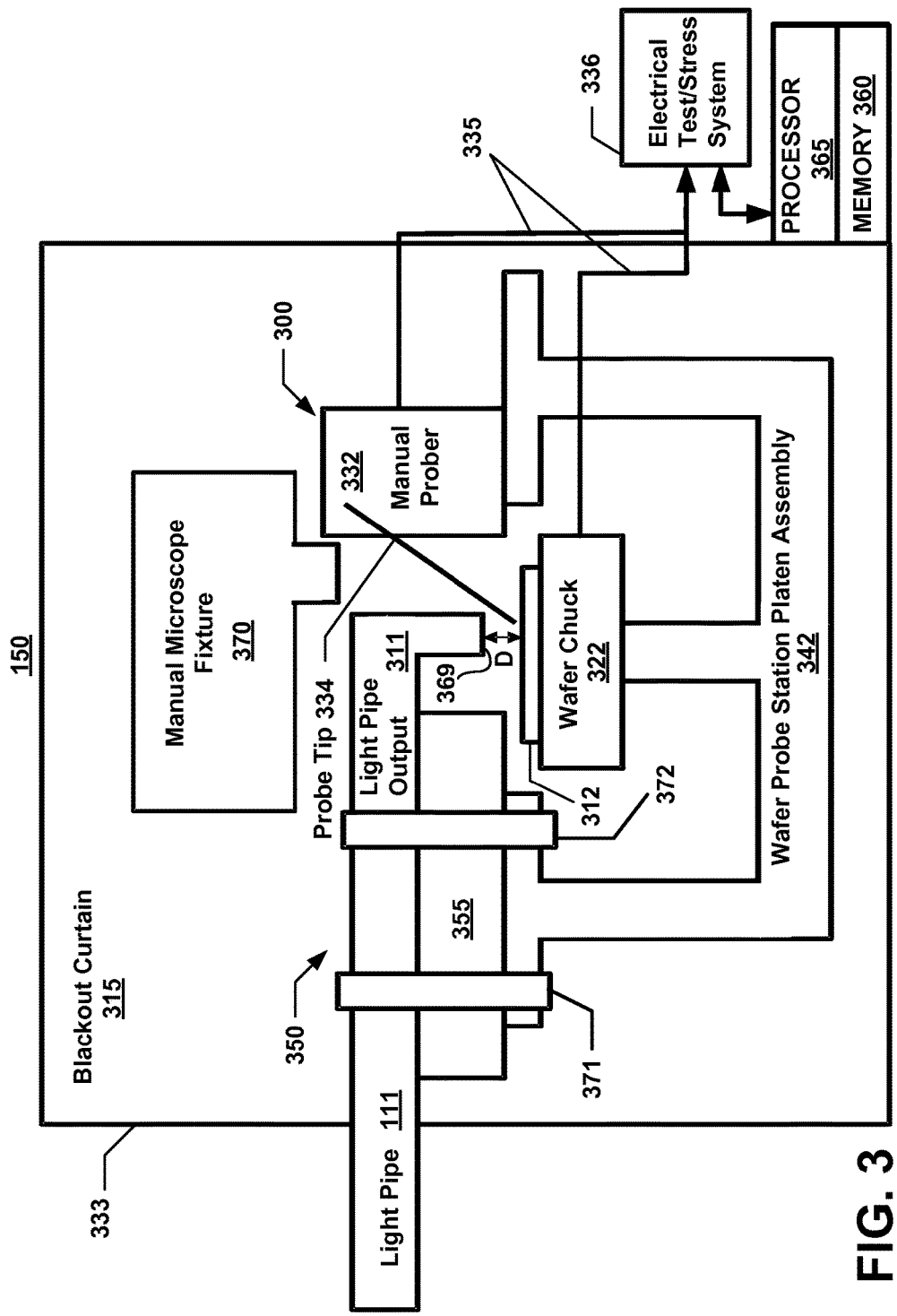
FIG. 3 is a block diagram of a wafer level electrical probe and illumination sub-system that includes a wafer level electrical probe sub-system integrated with an illumination delivery sub system, both sub-systems forming part of the probe system of FIG. 1.

With further reference to FIG. 3, it illustrates a wafer level electrical probe and illumination sub-system (WLEIS) 150 that includes the wafer level electrical probe sub-system 300 integrated with the illumination delivery sub system 350. The wafer level electrical probe sub-system 300 includes a wafer chuck 322, one or more manual probers 332, a microscope fixture 370, and a platen assembly 342 onto which the illumination delivery sub-system 350 is mounted. The components of the wafer level electrical probe sub-system 300 and the illumination delivery sub system 350 are positioned relative to each other with respect to the following two configurations: wafer loading/unloading configuration, and illumination/electrical stress configuration.

FIG. 3 shows the components figuratively positioned in the illumination/electrical stress configuration. An electrical probe tip 334 of the manual prober 332 is connected to a test wafer 312, with the manual prober 332 and the wafer chuck 322 being electrically connected to a remotely located electrical test/stress system 336, by means of cables 335. The electrical test/stress system 336 is the source of the electrical signals for the electrical test and electrical reliability capability of the present invention. It can be any known or available semiconductor parameter analyzer with similar functionality as the Semiconductor Characterization System, Model 4200-SCS, by Keithley Instruments, Inc., preferably provided with 4 Source-Measurement-Units (SMUs).

The electrical test/stress system 336 is positioned in a manner that allows the illumination delivery subsystem 350 to deliver light directly to the test wafer 312 at the location of probing, with the aperture of the light pipe 111 at a predetermined distance D from the test wafer 312. As it will be explained later, the distance D is important for the delivery of an exact intensity of light to the test wafer 312.

The wafer level electrical probe sub-system 300 is also provided with a blackout curtain 315 that is placed over the components of the sub-system 300, without touching sensitive equipment, such as the manual probers 332. The blackout curtain 315 is important to the setup in that it prevents light pollution that could significantly affect the test results.

A software application that embodies a custom test method, is stored on a memory 360 and processed by a processor 365. The test method is used to control the electrical stimulation and to measure the electrical performance of the test wafer 312, by means of the manual wafer probers 332. Alignment marks are positioned throughout the sub-system 300 for accurate and efficient re-configuration and setup.

The illumination delivery sub-system 350 further includes the output end 311 of the light pipe 111, a stabilization block 355, and means for securing the output end of the light pipe 111 onto the stabilization block 355, such as clamps 371, 372. As stated earlier, the illumination delivery sub-system 350 fits in a specified location on the wafer level electrical probe sub-system 300, so that the light emitted by the light pipe 111 is incident, directly over, and at a predetermined distance, D, from the output end 311 (or aperture 369 of the light pipe output end 311) to the device under test 312. This allows for the intensity of light to be determined with high fidelity. The output end 311 of the light pipe 111 is fastened to the stabilization block 355 so as to deliver a known intensity of light, with high repeatability, when the stabilization block 355 is placed in the correct position and locked into position. The alignment marks mentioned above aid in this process.

Figure 4:
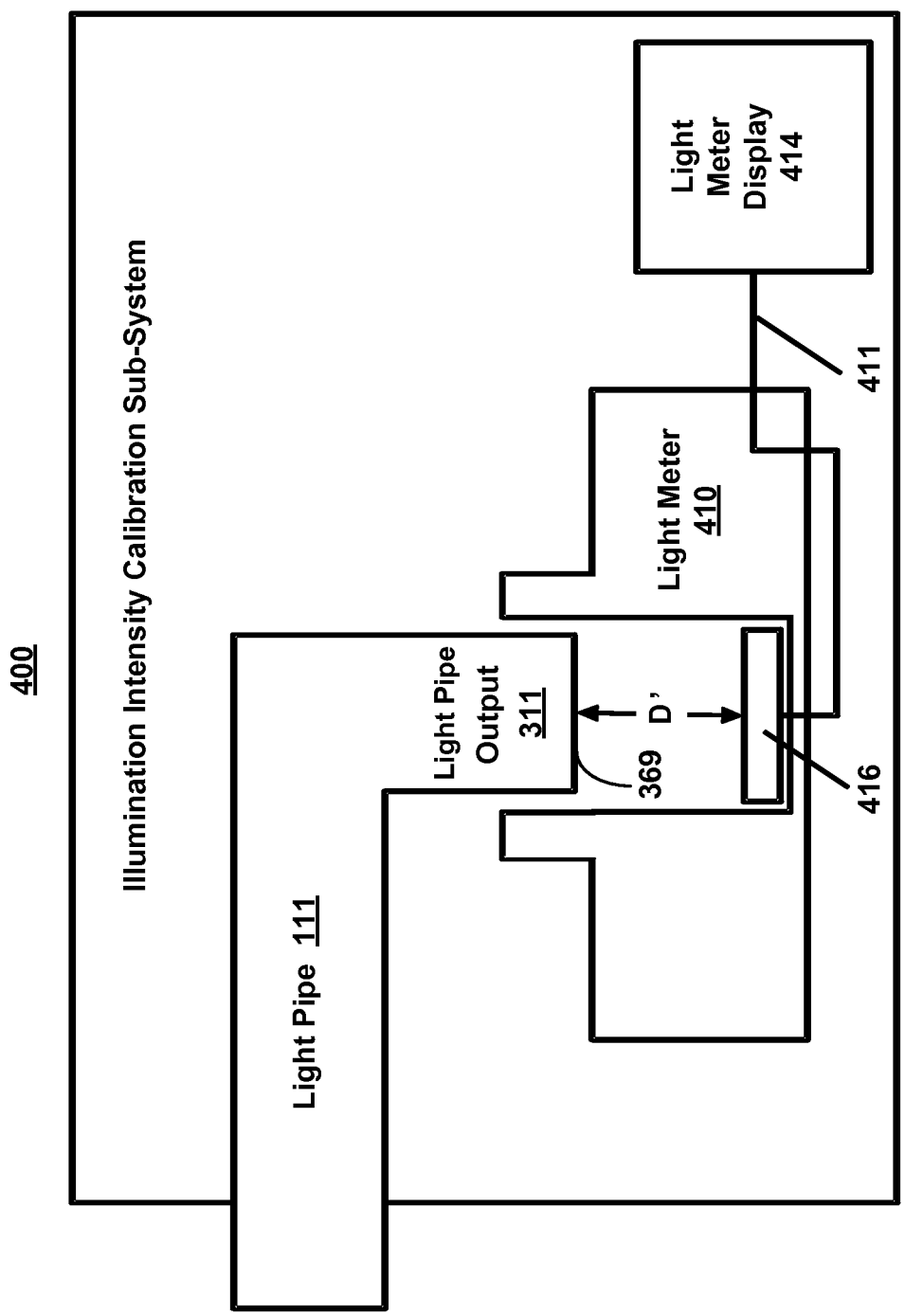
FIG. 4 is a block diagram of an illumination intensity calibration sub-system that forms part of the probe system of FIG. 1, and that is important for the delivery of an exact intensity of light to the wafer under test, showing a light meter case in cross-section.

With further reference to FIG. 4, the illumination intensity calibration sub-system 400 includes for example, a Milles-Griot Broadband light meter 410, which is fixed to the manual probers 332, such as by means of clamps, in such a manner that the aperture 369 of the light pipe output end 311 can be disposed at a predetermined, distance D', from the sensor (or detector) 416 of the light meter 410. This way, when the aperture 369 of the light pipe output end 311 is put a distance D' over the device under test 312, the exact intensity read by the light meter display 414 is the exact intensity exposed to the device under test 312.

Figure 6:
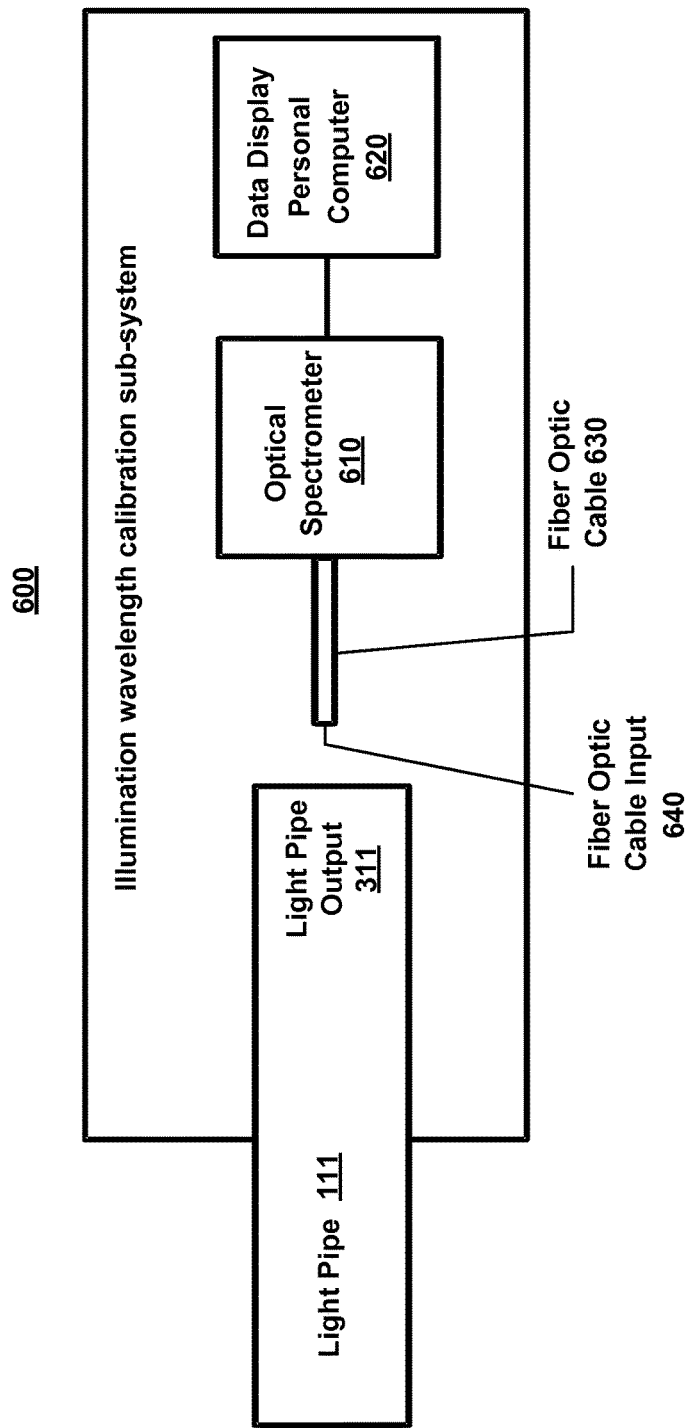
FIG. 6 is a block diagram of an illumination wavelength calibration sub-system that forms part of the probe system of FIG. 1, which is important for the delivery of exact wavelength (and thus photon energy) of light to the wafer under test.

With further reference to FIG. 6, the illumination wavelength calibration subs-system 600 includes an optical spectrometer 610 that is used to calibrate the entire wavelength spectrum of illumination used for any given test. With the illumination input sub-system 200 configured for a given test, the light pipe output 311 is placed in front of a fiber optic cable input 640. The light generated by the illumination input sub-system 200 is then measured by the optical spectrometer 610, and high fidelity wavelength data are displayed on the personal computer 620. An important aspect of the present invention is the ability to deliver light at an extremely well determined wavelength content and intensity. When understanding the physics of light interacting with materials, the more specific a wavelength used the more exacting conclusions can be drawn. An Ocean Optics S2000 optical spectrometer is an example of such an optical spectrum spectrometer 610, that can produce wavelength data such as peak wavelength in nanometers, give a full-width half maximum value, and provide a plot of relative intensity versus wavelength for the light used.

The present probe system 100 enables highly reliable and repeatable measurements of semiconductor devices over time with respect to various known and well-controlled illumination and electrical stimuli. The probe system 100 can simultaneously measure the electrical properties of a semiconductor device, such as a transistor threshold voltage, while stimulating the same device with an illumination stress. The probe system 100 combines the capabilities of an electrical probe system that performs electrical reliability measurements, with those of an optical illumination station that performs optical illumination studies. The result of this hybrid configuration is a unique tool that allows for reliability studies of illumination stimulation, electrical stimulation, and the interplay of both electrical and illumination stimulation (at various wavelengths and intensities) simultaneously.

The emergence of transparent electronics and further integration of electronics with illumination sources requires the exact knowledge of how semiconductor devices, developed for those technologies, react from a performance and reliability standpoint. In addition to this unique capability, there are several other unique qualities that render the probe system 100 useful and novel, among which are the following:

(a). The ability to determine the exact spectrum of wavelength at the device under test (e.g., test wafer 312), whether at the wafer level, circuit level, or component level.

(b). The ability to determine the exact intensity of illumination at the device under test.

(c). The ability of one system to conduct red, blue, green (RBG) (i.e., visible spectrum) and UV (UV spectrum) light reliability studies of electrical devices under simultaneous electrical stimulation. The electrical devices can be generalized as light sensitive devices that fit on the chuck area under the light pipe 111.

(d). The ability to remotely control the illumination wavelength and intensity of the incident light, so that studies in both wavelength-space and intensity-space can be conducted with the same probe system 100, and changes can be made to stimulation without exposing the wafer test sample 312 to ambient light.

(e). As a manual and reconfigurable system, the probe system 100 has the ability to accommodate wafer-level and non-wafer level samples 312 of varying lengths, widths, and heights, for development at the semiconductor device, circuit, prototype, and product levels.

Important illumination conditions include photon energy. By determining performance changes with photon energy, much is learned about the semiconductor and device system under test 312. This is achieved by designing the probe system 100 to generate well controlled and repeatable high fidelity light at the following exemplary wavelengths: 631 nm (red), 525 nm (green), 452 nm (blue), and UV. These wavelengths represent key elements of the spectrum. Typical light sources will generate light at red, green, and blue wavelengths. In addition, having a wavelength with energy above 3.4 eV, which is above the band gap of many Zinc Oxide-based thin film semiconductors, is of great value to gaining scientific knowledge of many transparent electronic devices.

Numerous light sources were tested and investigated, culminating in the conclusion that the sources using the preferred wavelengths, as described herein, have proven to be superior for controllability, repeatability, and fidelity. One example of a useful test includes conducting Negative Bias Temperature Instability (an electrical reliability test) while subjecting a Zinc Oxide transistor DUT to different wavelengths of illumination. The temporal change of the drain current compared to the gate voltage at various illumination photon energies would allow scientists to form more concrete theories about how to best model conduction, and the physics behind that conduction, in poly-crystalline ZnO thin-film transistors.

The first step in operating the probe system 100, that is conducting illumination reliability studies, is to setup the light source 210, 230 of the controllable wavelength and intensity illumination 200 in configuration A or B. Various illumination sources were tested for wavelength content and repeatability using the fiber optic spectrometer. In both configurations A and B of the controllable wavelength and intensity illumination input sub-system 200, the illumination sources 210, 230 are locked onto a fixture, such as the stabilization block 220.

In the visible spectrum case illustrated in FIG. 2, Configuration A, the wavelength and intensity of the light source 210 are controlled via remote control. The stabilization block 220 is specially designed to lock the input end 222 of the light pipe 111 and the light source 210 in position, relative to each other. The distance and the angle between 210 and 211 are key variables that must be fixed and predetermined.

In the ultraviolet spectrum case illustrated in FIG. 2, Configuration B, the wavelength is fixed and the intensity is controlled by careful calibration as the aperture of the light pipe input end 222 is held at specific, predetermined distances (at fixed angle) from the ultraviolet lamp 230.

Once the setup of the input controllable wavelength and intensity illumination input sub-system 200 is completed, the next step is to setup the wafer level electrical probe sub-system 300 and the illumination delivery sub-system 350, which, in combination with each other, are referred to as wafer level electrical probe and illumination sub-system (WLEIS) 150. WLEIS 150 is designed to deliver an accurate and repeatable wavelength and intensity of illumination stimulation to a wafer-level semiconductor device 312 that is also being electrically probed or tested.

To accomplish this task, the probe system 100 has been custom designed to present the following novel features:

The turret of a microscope 370 (FIG. 3) has been configured to allow the light pipe 111 into the space where an objective would typically be placed. In another embodiment, the output end 311 of the light pipe 111 is integrated with the microscope body or the microscope turret so as to more effectively use the space near the DUT and create a more automate-able configuration.

The left side of the prober platen assembly 342 has been configured to accommodate the illumination delivery sub-system 350, and marked for repeatable placement of the illumination delivery sub-system 350.

The illumination delivery sub-system 350 has been custom made to accommodate, and secure the output end 311 of the light pipe 111. The illumination delivery sub-system 350 allows the light from the input controllable wavelength and intensity illumination input sub-system 200 to be repeatedly and accurately placed above a test sample 312, while still allowing the test sample 312 to be probed, electrically.

A frame 333 supports the custom blackout curtain 315 to completely block out light while testing is underway. In many cases, semiconductor parts need to "settle" in the dark for hours before accurate dark and then controlled illumination tests can be accomplished.

At this stage, and with reference to FIG. 4, the illumination calibration sub-system 400 can be used, if necessary, to calibrate the intensity levels of the incident light beam from the light pipe 111 that are required for testing. This sub-system 400 is novel in that it enables a repeatable way to accurately calibrate illumination intensity of the exact replicable setup. The sub-system 400 puts the actual light meter detector 416 (rather than the opening or the aperture bottom) at the same distance, D, the device-under-test (DUT) 312 will be during testing.

A non-standard re-configuration of the light meter 410 (FIG. 4) is implemented to achieve this result.

The optical spectrometer 610 is used to sense the output 311 of the light pipe 111, in order to measure the illumination wavelength spectrum with high fidelity.

With the light source system 200 set up and calibrated and the WLEIS 150 set up, a semiconductor sample (or device under test, DUT) 312 is loaded and electrically tested. Once a predetermined DUT 312 is loaded the WLEIS 150 is re-configured via a specially developed method (with electrical probe tips contacting the DUT 312); the illumination delivery sub-system 350 is placed so that the light pipe output 311 is directly above the DUT 312, at a known distance, D, (FIGS. 3, 4).

The design of the WLEIS 150 allows for the re-configuration of the wafer level electrical probe sub-system 300 and the illumination delivery sub-system 350, while the DUT 312 is contracted by probe tip 334 (FIG. 3). This is an important aspect of the present invention in that contact cannot be made to the DUT 312 without the microscope 370 over the DUT 312, but illumination cannot be exposed to the DUT 312 without the output 311 of the light pipe 111 over the DUT 312, and both cannot exist in the same place at the same time. Therefore, the load-contract-move microscope-illuminate procedure described above (steps 535 through 570 in FIG. 5) is important for the ability to complete a test where the DUT 312 is concurrently electrically probed and exposed to illumination.

Once the illumination delivery sub-system 350 is in place, the blackout curtain 315 is lowered over the entire probe system 100, a "dark" waiting time is observed based on the test or technology requirement, and then electrical testing and illumination is started, in synchronized time, so that the electrical and illumination stimuli times are identical. Electrical stimulation, results, and data are monitored with the Keithley 4200 Semiconductor Characterization System (SCS).

Figure 5:
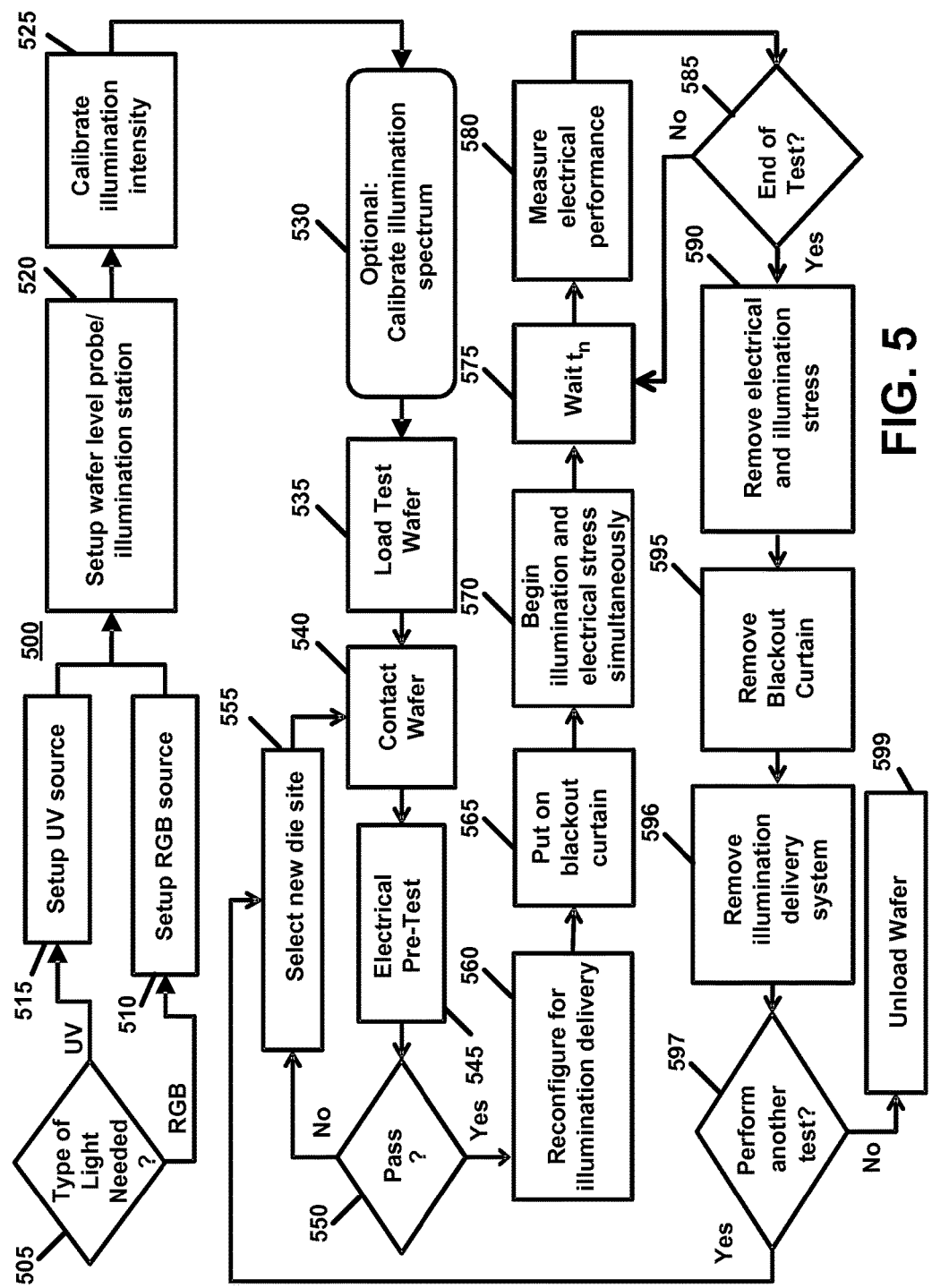
FIG. 5 is a flow chart that illustrates the method of use of the probe system of FIG. 1.

Referring now to FIG. 5, it shows a flow chart that illustrates a method 500 of using the probe system 100. At step 505, an operator selects the type of light needed for the controllable wavelength and intensity illumination input sub-system 200. If the visible light spectrum (RGB) is selected, the operator completes the setup, at step 510, according to configuration A, as described earlier in connection with FIG. 2. If however, the operator selects the UV light spectrum, at step 505, then the operator completes the setup, at step 515, according to configuration B, as described earlier in connection with FIG. 2.

The operator then proceeds to step 520 and sets up the wafer level electrical probe sub-system 300, as described earlier in connection with FIG. 3. The operator then calibrates the illumination intensity of the probe system 100, as described earlier in connection with FIG. 4 (step 525). Optionally, at step 530, the operator calibrates the illumination spectrum of the incident light spectrum at the output end 311 of the light pipe 111.

The operator then loads the DUT 312 onto the wafer chuck 322, at step 535. At step 540, the operator positions the manual prober 332 and electrical probe 334 to contact the DUT 312. The operator then conducts an electrical pre-test of the DUT 312, at step 545, in order to determine if the functionality of the DUT 312 is acceptable for continued reliability testing (screening test).

If the operator determines at step 550 that the electrical pre-test was not successful, then the operator selects a new die site on the DUT 312, and continues with the test loop (steps 540, 545, 550) until the electrical pre-test is successful. The operator then reconfigures the wafer level electrical probe sub-system 300 and the illumination delivery sub-system 350 for illumination delivery, at step 560, so that illumination is delivered to the DUT 312 with known (or predetermined) intensity and spectral content.

The operator then covers the probe system 100 with the blackout curtain 315, at step 565, as described earlier. The operator starts the illumination and electrical stress tests, simultaneously, at step 570, and waits for a predetermined period of time, $t_n$, at step 575. The period of time $t_n$ is a predetermined increment of time decided by the designer of the experimental plan. In NBTI tests, $t_n$ can typically range from seconds to minutes, or change as time progresses.

At step 580, the operator measures the electrical performance of the DUT 312, and determines at step 585, if the test is completed. If not, the operator proceeds to steps 575 and 580, until it is determined at step 585, that the test is complete.

Once the test is complete, the operator removes the electrical and illumination stress, at step 590, removes the blackout curtain 315 at step 595, and also removes the illumination delivery sub-system 350 at step 596.

If the operator determines at step 597, that another test needs to be performed, then the operator proceeds to step 555 and loops through the steps of the process 500, until it is determined, at step 597, that no further test is needed. At which time, the operator unloads the DUT 312, at step 599.

It is to be understood that the phraseology and terminology used herein with reference to device, mechanism, system, or element orientation are only used to simplify the description of the present invention, and do not alone indicate or imply that the mechanism or element referred to must have a particular orientation. In addition, listing terms such as "a", "b", c", "first", "second", and "third" are used herein and in the appended claims for purposes of description and are not intended to indicate or imply relative importance or significance.

It is also to be understood that the invention is not limited in its application to the details of construction and the arrangements of components set forth in the following description or illustrated in the drawings. Other modifications may be made to the present design without departing from the spirit and scope of the invention. The present invention is capable of other embodiments and of being practiced or of being carried out in various ways, such as, for example, in military and commercial applications.

What is claimed is:

1. A probe system that allows for concurrent studies of the effect of illumination stimulation, electrical stimulation, and interplay of electrical and illumination stimulation onto a light sensitive device, the probe system comprising:
   a controllable wavelength and intensity illumination input sub-system that provides alternate configurations and that includes a light source for generating light at a predefined wavelength;
   an electrical probe sub-system for initiating an electrical stress test of the light sensitive device and that includes a chuck onto which the light sensitive device is placed;
   an illumination delivery sub-system for initiating an illumination stress test of the light sensitive device concurrent with the electrical stress test of the light sensitive device;
   an illumination intensity calibration sub-system comprising a light detector;
   an illumination wavelength calibration sub-system; and
   an interconnecting light guide having an aperture that is mounted at a predetermined distance, D, from the light sensitive device, for transmitting the light directly onto the light sensitive device, wherein prior to illuminating the light sensitive device, the light intensity at the precise location of the light sensitive device is determined with high fidelity through direct measurement of the transmitted light by the light detector of the illumination intensity calibration sub-system, the light detector positioned at the predetermined distance, D, from the aperture of the interconnecting light guide.

2. The probe system of claim 1, wherein the alternate configurations of the controllable wavelength and intensity illumination input sub-system include:
   a visible light spectrum configuration; and
   an ultraviolet light spectrum configuration.

3. The probe system of claim 2, wherein the visible light spectrum configuration provides light within the visible light spectrum.

4. The probe system of claim 2, wherein the ultraviolet light spectrum configuration provides light within the ultraviolet light spectrum.

5. The probe system of claim 2, wherein the light source and the interconnecting light guide are precisely aligned and locked into position relative to each other.

6. The probe system of claim 2, wherein the electrical probe sub-system includes one or more probers, a microscope fixture, and a platen assembly onto which the illumination delivery sub-system is mounted.

7. The probe system of claim 6, wherein the electrical probe sub-system is a wafer level electrical probe sub-system.

8. The probe system of claim 7, wherein the light sensitive device is a wafer.

9. The probe system of claim 1, wherein the light sensitive device includes transparent electronics.

10. The probe system of claim 1, wherein the light sensitive device includes zinc oxide-based thin film semiconductors.

11. The probe system of claim 1, wherein the light sensitive device includes zinc oxide transistors.

12. A method of using probe system that allows for concurrent studies of the effect of illumination stimulation, electrical stimulation, and interplay of electrical and illumination stimulation onto a light sensitive device, the method comprising:

providing a controllable wavelength and intensity illumination input sub-system that provides alternate configurations, and that includes a light source that generates light at a predefined wavelength, for allowing the selection of one of said alternate configurations;

providing an illumination intensity calibration sub-system for allowing the calibration of an illumination intensity and illumination spectrum of the generated light at an output end of a light pipe of an illumination delivery sub-system;

prior to delivering illumination to the light sensitive device, taking a direct measurement of the generated light by a light detector of the illumination intensity calibration sub-system positioned at a predetermined distance, D, from the output end of the light pipe;

loading the light sensitive device onto a chuck of an electrical probe sub-system;

reconfiguring the electrical probe sub-system and the illumination delivery sub-system, such that the light sensitive device is at the predetermined distance, D, from the output end of the light pipe so that illumination is delivered to the light sensitive device with known intensity and spectral content with high fidelity at the precise location of the light sensitive device; and initiating an illumination stress test of the light sensitive device concurrent with an electrical stress test of the light sensitive device.

\* \* \* \* \*